(12) United States Patent
Jia et al.

(10) Patent No.: US 9,995,976 B2
(45) Date of Patent: Jun. 12, 2018

(54) ARRAY SUBSTRATE AND MANUFACTURING METHOD THEREOF, DISPLAY PANEL AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Weihua Jia, Beijing (CN); Peng Jiang, Beijing (CN); Haipeng Yang, Beijing (CN); Yong Jun Yoon, Beijing (CN); Zhangtao Wang, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 36 days.

(21) Appl. No.: 15/234,288

(22) Filed: Aug. 11, 2016

(65) Prior Publication Data
US 2017/0108745 A1 Apr. 20, 2017

(30) Foreign Application Priority Data

Oct. 20, 2015 (CN) .......................... 2015 1 0685426

(51) Int. Cl.
*G02F 1/1362* (2006.01)
*G02F 1/1343* (2006.01)
(Continued)

(52) U.S. Cl.
CPC .... *G02F 1/134336* (2013.01); *G02F 1/13439* (2013.01); *G02F 1/133345* (2013.01);
(Continued)

(58) Field of Classification Search
None
See application file for complete search history.

(56) References Cited

U.S. PATENT DOCUMENTS 6,486,933 B1 * 11/2002 Cha .................... G02F 1/134363
349/110
7,800,704 B2 * 9/2010 Lin .................... G02F 1/136286
349/38
(Continued)

FOREIGN PATENT DOCUMENTS

| CN | 101770125 A | 7/2010 |
|---|---|---|
| CN | 103676369 A | 3/2014 |
| CN | 104950540 A | 9/2015 |
| CN | 104965367 A | 10/2015 |

OTHER PUBLICATIONS

Chinese Office Action in Chinese Application No. 201510685426.X in Chinese, dated Sep. 8, 2017 with English translation.

*Primary Examiner* — Eric Ward
(74) *Attorney, Agent, or Firm* — Collard & Roe, P.C.

(57) ABSTRACT

An array substrate and a manufacturing method thereof, a display panel and a display device are provided. The array substrate includes a base substrate, a plurality of pixel units arranged in a matrix and a plurality of common electrode lines extending along the column direction on the base substrate. There are two scanning signal lines between two adjacent rows of pixel units, and pixel units in a (2N+1)-th column and a (2N+2)-th column are taken as one pixel unit group, N being selected from integers greater than or equal to zero. The respective common electrode lines are located between two adjacent pixel unit groups.

14 Claims, 14 Drawing Sheets

(51) Int. Cl.
*G02F 1/1333* (2006.01)
*H01L 27/12* (2006.01)
*G02F 1/1368* (2006.01)
*G02F 1/1337* (2006.01)

(52) U.S. Cl.
CPC ...... *G02F 1/136286* (2013.01); *H01L 27/124* (2013.01); *H01L 27/1262* (2013.01); *G02F 1/1368* (2013.01); *G02F 1/133707* (2013.01); *G02F 1/134363* (2013.01); *G02F 1/136227* (2013.01); *G02F 2001/134318* (2013.01); *G02F 2001/134345* (2013.01); *G02F 2001/136295* (2013.01); *G02F 2201/121* (2013.01); *G02F 2201/123* (2013.01); *G02F 2201/40* (2013.01)

(56) References Cited

U.S. PATENT DOCUMENTS

| | | | |
|---|---|---|---|
| 2004/0046725 A1* | 3/2004 | Lee | G09G 3/3607 345/88 |
| 2014/0070221 A1 | 3/2014 | Li | |
| 2015/0029080 A1* | 1/2015 | Kwon | G09G 3/3648 345/90 |
| 2015/0129877 A1* | 5/2015 | Cho | G02F 1/134363 257/59 |
| 2017/0205676 A1 | 7/2017 | Li et al. | |
| 2017/0207252 A1 | 7/2017 | Xu et al. | |

\* cited by examiner

ARRAY SUBSTRATE AND MANUFACTURING METHOD THEREOF, DISPLAY PANEL AND DISPLAY DEVICE

CROSS REFERENCE TO RELATED APPLICATIONS

Applicant claims priority under 35 U.S.C. § 119 of Chinese Application No. 201510685426.X filed on Oct. 20, 2015, the disclosure of which is incorporated by reference.

TECHNICAL FIELD

At least one embodiment of the present disclosure relates to an array substrate and a manufacturing method thereof, a display panel and a display device.

BACKGROUND

A Thin Film Transistor-Liquid Crystal Display (TFT-LCD) is to change orientation of liquid crystal molecules by using changes in intensity of an electric field sandwiched between upper and lower substrates, so as to control intensity of light transmittance to display an image. In general, a complete liquid crystal display panel must have a backlight module, a polaroid, a TFT substrate (a lower substrate), a Color Filter (CF) substrate (an upper substrate) and a liquid crystal molecule layer filled in a box formed by the upper and lower substrates. There are a large number of pixel electrodes on the TFT substrate, and turning on and off voltage as well as magnitude of voltage on the pixel electrode is controlled by a gate electrode signal connected with a transverse scanning signal line and a source electrode signal connected with a longitudinal data line. The orientation of liquid crystal molecules is controlled by changes in intensity of an electric field between the common electrode and the pixel electrode. A storage capacitor may be formed between the common electrode (Vcom) line and the pixel electrode on the TFT substrate, so as to maintain state of the liquid crystal molecules before a next signal is coming.

At present, the TFT substrate may adopt a dual gate design, which can effectively reduce a number of IC joints of the data line, to achieve an effect of reducing cost. Generally, a panel of a dual-gate design usually has a common electrode line parallel to a scanning signal line and a common electrode line parallel to a data line, so that an aperture ratio of pixel is low.

SUMMARY

At least one embodiment of the disclosure provides an array substrate and a manufacturing method thereof, a display panel and a display device. The array substrate is provided with a plurality of common electrode lines along a column direction of multiple pixel units, so as to optimize the common electrode resistance in the plane of a display screen, improve a greenish phenomenon; meanwhile, the common electrode lines in a row direction are removed, which enhances the aperture ratio.

At least one embodiment of the disclosure provides an array substrate, comprising a base substrate, a plurality of pixel units arranged in a matrix along a row direction and a column direction and a plurality of common electrode lines extending along the column direction on the base substrate; wherein, there are two scanning signal lines between two adjacent rows of pixel units, and pixel units in a (2N+1)-th column and a (2N+2)-th column are taken as one pixel unit group, N being selected from integers greater than or equal to zero; two pixel units of a same row in a same pixel unit group are connected with different scanning signal lines, the scanning signal lines extending along the row direction; there is one data signal line between two columns of pixel units in each pixel unit group, and each pixel unit group shares the data signal line between the two columns of pixel units, the data signal line extending along the column direction; the respective common electrode lines are located between two adjacent pixel unit groups.

For example, in the array substrate according to some embodiments, the respective common electrode lines and the data signal line are arranged in a same layer.

For example, in the array substrate according to some embodiments, the respective common electrode lines include two parts, one part including a plurality of main body portions of common electrode lines, the plurality of main body portions of common electrode lines being arranged in a layer the same as that of the scanning signal lines, and disconnected in positions of the two scanning signal lines between two adjacent rows of pixel units, and another part including a plurality of connecting lines, the plurality of connecting lines and pixel electrodes being arranged in a same layer, the respective connecting lines being connected with two of the main body portions of common electrode lines disconnected in the positions of the scanning signal lines through via holes.

For example, the array substrate according to some embodiments further comprises common electrodes, wherein, the plurality of main body portions of common electrode lines in the respective common electrode lines are electrically connected with the common electrodes in two columns of pixel units adjacent thereto.

For example, in the array substrate according to some embodiments, the respective scanning signal lines are narrowed in positions overlapping with the connection lines.

For example, in the array substrate according to some embodiments, in pixel units of a same row, two adjacent pixel units in adjacent pixel unit groups are connected with different scanning signal lines or connected with a same scanning signal line.

For example, in the array substrate according to some embodiments, there is one of the common electrode lines between every two adjacent pixel unit groups.

For example, the array substrate according to some embodiments further comprises at least one insulating layer, wherein, the at least one insulating layer is located between a layer where the common electrode lines are located and a layer where the common electrodes are located, the common electrodes being electrically connected with the common electrode lines through via holes located in the insulating layer.

For example, in the array substrate according to some embodiments, the via holes of insulating layer are arranged periodically.

For example, in the array substrate according to some embodiments, the via holes of insulating layer are arranged periodically, and in the column direction, one of the via holes of insulating layer is arranged every X pixel units, X being an integer greater than zero.

At least one embodiment of the disclosure provides a manufacturing method of an array substrate, comprising forming a plurality of pixel units arranged in a matrix along a row direction and a column direction and a plurality of common electrode lines extending along the column direction on a base substrate; wherein, there are two scanning signal lines between two adjacent rows of pixel units, and pixel units in a (2N+1)-th column and a (2N+2)-th column are taken as one pixel unit group, N being selected from integers greater than or equal to zero; connecting two pixel units of a same row in a same pixel unit group with different scanning signal lines, the scanning signal lines extending along the row direction; forming one data signal line between two columns of pixel units in each pixel unit group, and each pixel unit group sharing the data signal line between the two columns of pixel units, the data signal line extending along the column direction; and forming the respective common electrode lines between two adjacent pixel unit groups.

For example, in the manufacturing method of the array substrate according to some embodiments, the respective common electrode lines and the data signal line are formed in a same layer.

For example, in the manufacturing method of the array substrate according to some embodiments, the respective common electrode lines include two parts, one part including a plurality of main body portions of common electrode lines, the plurality of main body portions of common electrode lines being formed in a layer the same as that of the scanning signal lines, and disconnected in positions of the two scanning signal lines between two adjacent rows of pixel units, and the other part including a plurality of connecting lines, the plurality of connecting lines and pixel electrodes being formed in a same layer, the respective connecting lines being connected with two of the main body portions of common electrode lines disconnected in the positions of the scanning signal lines through via holes.

For example, the manufacturing method of the array substrate according to some embodiments further comprises forming common electrodes, wherein, the plurality of main body portions of common electrode lines in the respective common electrode lines are electrically connected with the common electrodes in two columns of pixel units adjacent thereto.

For example, in the manufacturing method of the array substrate according to some embodiments, one of the common electrode lines is formed between every two adjacent pixel unit groups.

For example, the manufacturing method of the array substrate according to some embodiments further comprises forming at least one insulating layer, wherein, the at least one insulating layer is located between a layer where the common electrode lines are located and a layer where the common electrodes are located, the common electrodes being electrically connected with the common electrode lines through via holes located in the insulating layer.

At least one embodiment of the disclosure provides a display panel, comprising the array substrate as mentioned above.

At least one embodiment of the disclosure provides a display device, comprising the display panel as mentioned above.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, technical terms or scientific terms used in the present disclosure should be of general meaning as understood by those ordinarily skilled in the art. "First", "second" and similar words used in the present disclosure do not represent any sequence, quantity or importance and merely intend to differentiate different composite parts. Similarly, words such as "one", "a/an" or "the" or the like do not denote quantitative limitation, but rather indicate there is at least one. Words such as "include" or "comprise" and the like denote that elements or objects appearing before the words of "include" or "comprise" cover the elements or the objects enumerated after the words of "include" or "comprise" or equivalents thereof, not exclusive of other elements or objects. Words such as "connected" or "connecting" and the like are not limited to physical or mechanical connections, but may include electrical connection, either direct or indirect. Words such as "up", "down", "left", "right" and the like are only used for expressing relative positional relationship, when the absolute position of a described object is changed, the relative positional relationship may also be correspondingly changed.

It should be noted that, in the present disclosure, "a same layer" refers to a layer structure which is formed by a film layer formed by a same film-forming process and used for forming specific patterns in a one-time patterning process with a same mask. According to different specific patterns, the one-time patterning process may include multiple times of exposing, developing or etching process, and the specific patterns formed in the layer structure may be continuous or discontinuous. The specific patterns formed by different patterning processes may have different thicknesses.

Figure 1A:
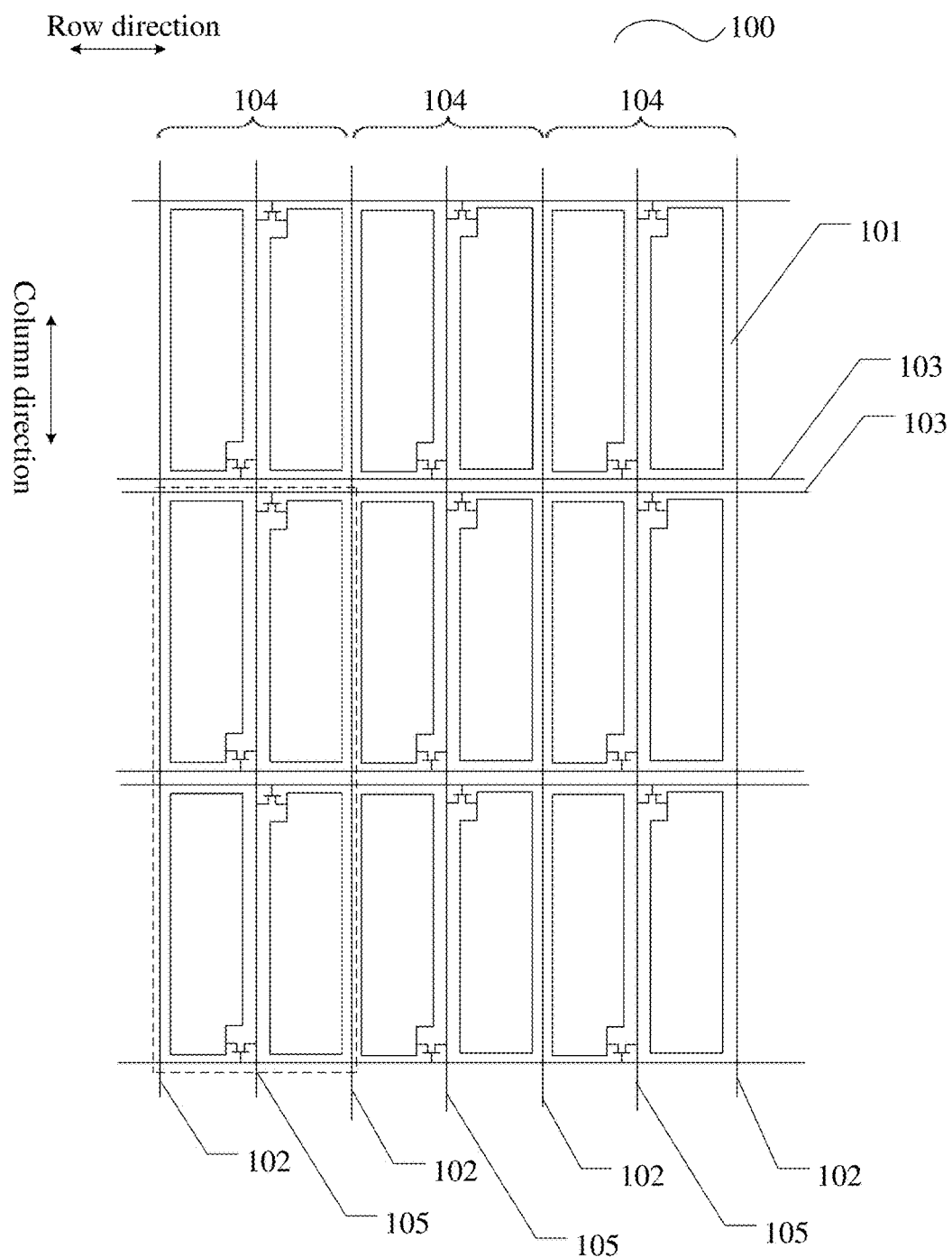
FIG. 1a is a schematic diagram of an array substrate provided by an embodiment of the present disclosure.

At least one embodiment of the present disclosure provides an array substrate, as illustrated in FIG. 1a, comprising a base substrate 100, a plurality of pixel units 101 arranged in a matrix along a row direction and a column direction and a plurality of common electrode lines 102 extending along the column direction on the base substrate 100. Pixel units 101 in a (2N+1)-th column and a (2N+2)-th column are taken as one pixel unit group 104, wherein, N is selected from integers greater than or equal to zero. For example, among the plurality of pixel units, two adjacent columns of pixel units are divided into one pixel unit group, and the pixel units in the respective pixel unit groups are different.

There are two scanning signal lines 103 between two adjacent rows of pixel units 101. For example, for each row of pixel units, either side in a column direction thereof is provided with one scanning signal line, respectively. Two pixel units 101 of a same row in a same pixel unit group (belonging to a same row) are connected with different scanning signal lines 103, and the scanning signal lines 103 extend along the row direction. For example, pixel units 101 in each row are connected with the scanning signal lines 103 located on both sides in a column direction of the row of pixel units, respectively.

It should be noted that, there are two scanning signal lines between two adjacent rows of pixel units. For example, it indicates that there are two scanning signal lines between any two adjacent rows of pixel units. For example, it indicates that there are two scanning signal lines between pixel units in a (M+1)-th row and a (M+2)-th row, wherein, M is selected from integers greater than or equal to zero.

There is a data signal line 105 between two columns of pixel units 101 in each pixel unit group 104, and each pixel unit group 104 shares the data signal line 105 between the two columns of pixel units 101, and the data signal line 105 extends along the column direction. For example, two columns of pixel units on both sides of each data signal line 105 are of a pixel unit group 104.

The respective common electrode lines 102 are located between two adjacent pixel unit groups 104.

Figure 1B:
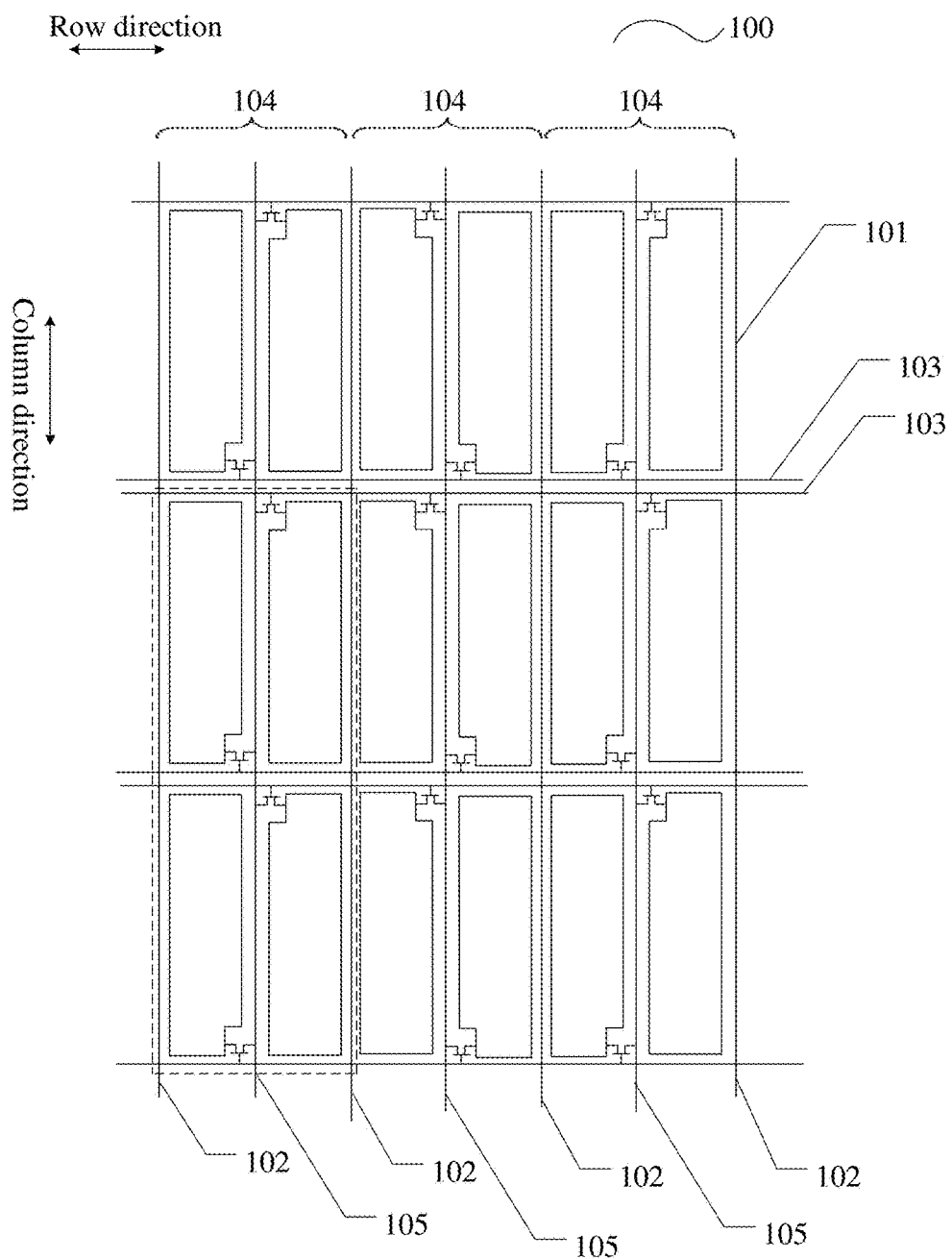
FIG. 1b is a schematic diagram of another array substrate provided by an embodiment of the present disclosure.

For example, as illustrated in FIG. 1a, in pixel units of a same row, two adjacent pixel units 101 in adjacent pixel unit groups may be connected with a same scanning signal line, or may be connected with different scanning signal lines, as illustrated in FIG. 1b.

The pixel units according to the respective embodiments of the present disclosure, for example, refer to sub-pixels. Each sub-pixel, for example, includes one scanning signal line, one data signal line, one pixel electrode and one thin film transistor. Adjacent sub-pixels may share one data signal line.

In an array substrate provided by at least one embodiment of the present disclosure, a common electrode line extending along a row direction of a plurality of pixel units (parallel to a scanning signal line) is removed, and only a plurality of common electrode lines extending along a column direction of the plurality of pixel units (parallel to a data signal line) are reserved. Since the common electrode line extending along the row direction of the plurality of pixel units (parallel to the scanning signal line) is removed, an aperture ratio is greatly improved.

At least one embodiment of the present disclosure further provides a manufacturing method of an array substrate, comprising forming a plurality of pixel units arranged in a matrix along a row direction and a column direction on a base substrate and a plurality of common electrode lines extending along the column direction. There are two scanning signal lines between two adjacent rows of pixel units, and pixel units in a (2N+1)-th column and a (2N+2)-th column are taken as one pixel unit group, wherein, N is selected from integers greater than or equal to zero.

Two pixel units of a same row in a same pixel unit group are connected with different scanning signal lines, and the scanning signal lines extend along the row direction;

One data signal line is formed between two columns of pixel units in each pixel unit group, and each pixel unit group shares the data signal line between the two columns of pixel units, the data signal line extends along the column direction.

The respective common electrode lines are formed between two adjacent pixel unit groups.

For example, the common electrode lines may be formed by processes such as depositing a metal film, coating a photoresist, exposing and developing to obtain a photoresist pattern, etching a metal thin film and so on. Or, it may be formed in other ways.

For example, the common electrode lines may be made of a layer of metal thin film separately. Or, it may be arranged in a same layer with general metal lines (e.g., a scanning signal line, a data signal line and so on) in the array substrate. In a case that it is disconnected in some positions, other conductive material layers may be used for lapping.

Hereinafter, it is described by taking an example that the common electrode lines are arranged in a same layer with the scanning signal lines or the data signal line.

Embodiment 1

Figure 2A:
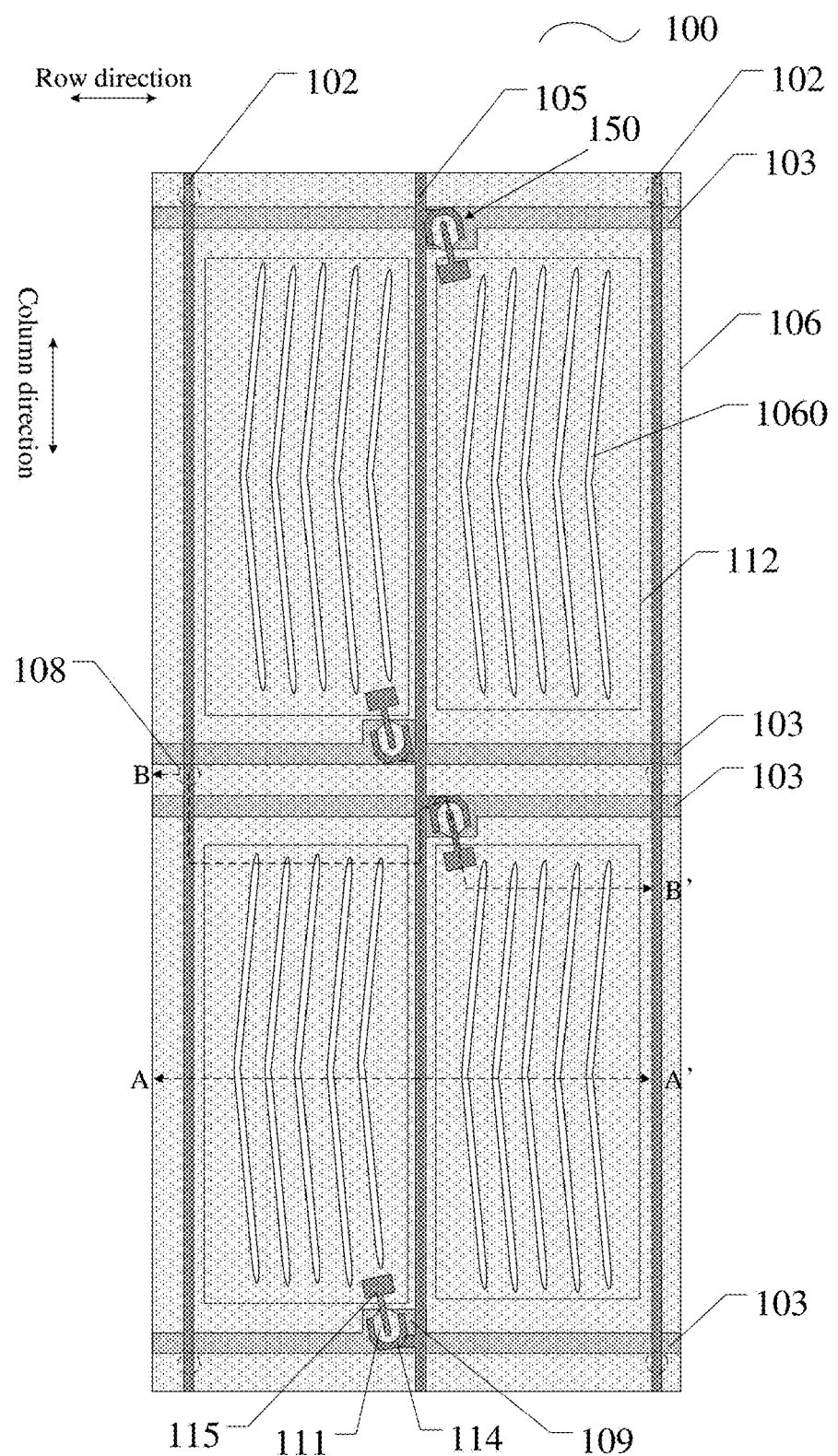
FIG. 2a is a schematic diagram of a dotted part illustrated in FIG. 1 provided by the embodiment of the present disclosure.

The embodiment provides an array substrate, as illustrated in FIG. 1a and FIG. 2a, comprising a base substrate 100, a plurality of pixel units 101 arranged in a matrix along a row direction and a column direction and a plurality of common electrode lines 102 extending along the column direction on the base substrate 100. There are two scanning signal lines 103 between two adjacent rows of pixel units 101, and pixel units 101 in a (2N+1)-th column and a (2N+2)-th column are taken as one pixel unit group 104, wherein, N is selected from integers greater than or equal to zero.

Two pixel units 101 of a same row in a same pixel unit group (belonging to a same row) are connected with different scanning signal lines 103, and the scanning signal lines 103 extend along the row direction.

There is a data signal line 105 between two columns of pixel units 101 in each pixel unit group 104, and each pixel unit group 104 shares the data signal line 105 between the two columns of pixel units 101, and the data signal line 105 extends along the column direction.

The respective common electrode lines 102 are located between two adjacent pixel unit groups 104. The respective common electrode lines 102 and the data signal line 105 are arranged in a same layer.

For example, as illustrated in FIG. 1a and FIG. 2a, there is a common electrode line between every two adjacent pixel unit groups 104. The following respective embodiments may be same as that.

For example, as illustrated in FIG. 1a and FIG. 2a, one thin film transistor is arranged in each pixel unit. The following respective embodiments may be same as that.

For example, the row direction is a horizontal direction, and the column direction is perpendicular to the row direction. The row direction and the column direction are in a plane. For example, the row direction and the column direction are directions parallel to a paper surface. The following respective embodiments may be same as that.

Figure 2B:
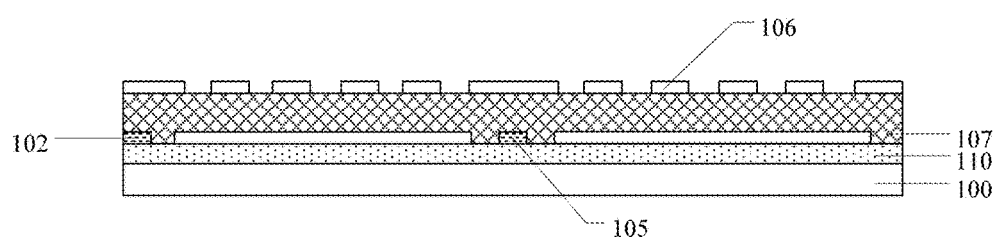
FIG. 2b is a cross-sectional view along an A-A' direction of the array substrate illustrated in FIG. 2a provided by the embodiment of the present disclosure.
Figure 2C:
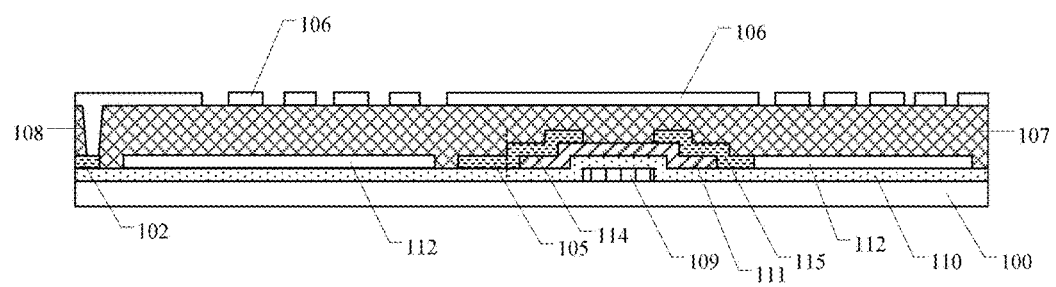
FIG. 2c is a cross-sectional view along a B-B' direction of the array substrate illustrated in FIG. 2a provided by the embodiment of the present disclosure.

For example, in one example of the embodiment, as illustrated in FIG. 2a to FIG. 2c, the array substrate further comprises common electrodes 106. As illustrated in FIG. 2a and FIG. 2c, the common electrodes 106 are electrically connected with the respective common electrode lines 102.

For example, as illustrated in FIG. 2b and FIG. 2c, in one example of the embodiment, the array substrate further comprises a first insulating layer 107, and the first insulating layer 107 is located between a layer where the respective common electrode lines 102 are located and a layer where the common electrodes 106 are located. As illustrated in FIG. 2c, the common electrodes 106 are electrically connected with the common electrode line 102 through via holes 108 located in the first insulating layer 107.

For example, in one example of the embodiment, as illustrated in FIG. 2c, FIG. 2c is an array substrate of a High Advanced-Super Dimensional Switching (HADS) mode, and a gate electrode 109 is arranged on the base substrate 100. A gate insulating layer 110 is arranged above a layer where the gate electrode 109 is located. An active layer 111 is arranged above the gate insulating layer 110. Pixel electrodes 112 are arranged above the gate insulating layer 110. A common electrode line 102 or a data signal line 105 is arranged in a gap between two adjacent pixel electrodes in the column direction, and the common electrode line 102 and the data signal line 105 are arranged at intervals, that is, one common electrode line is arranged between two adjacent data signal lines 105. The common electrode line 102 and the data signal line 105 may refer to FIG. 1a and related descriptions. The respective common electrode lines 102 and the data signal line 105 are arranged in a same layer. A source electrode 114 and a drain electrode 115 are arranged on the active layer 111. The source electrode 114 and the drain electrode 115 are arranged on the active layer 111 apart from each other, and are both connected with the active layer 111, a channel region is defined by a gap between the source electrode 114 and the drain electrode 115, and the drain electrode 115 is electrically connected with the pixel electrode 112. The first insulating layer 107 is arranged above the common electrode line 102, the data signal line 105, the source electrode 114, the drain electrode 115 and the pixel electrodes 112. Via holes 108 of insulating layer are arranged in the first insulating layer 107, and common electrodes 106 are arranged on the first insulating layer 107. The common electrodes 106 are electrically connected with the common electrode lines 102 through the via holes 108 of insulating layer.

For example, the scanning signal line is used for providing a turning-on or turning-off signal to the thin film transistor, and the data signal line is used for providing a data signal to the pixel electrode, to realize gray display by controlling deflection of liquid crystal.

For example, in one example of the embodiment, the via holes of insulating layer are arranged periodically.

For example, in one example of the embodiment, the via holes of insulating layer may be arranged periodically according to a size of a display screen. For example, one via hole of insulating layer is arranged every X pixel units. For example, X is any integer greater than zero. For example, X=1, X=2, X=4, X=6 or X=8, etc., and for example, X may be any integer from 1 to 8. However, it is not limited to the given specific value of X.

The common electrode layer is connected with the common electrode lines on the bottom through the via holes of insulating layer arranged periodically, so as to reduce a common resistance of a display screen, and balance a common voltage of the display screen. The plurality of common electrode lines extending along the column direction may improve a greenish phenomenon of the display screen. The via holes of insulating layer may be arranged according to needs. A size of the via hole of insulating layer may be designed according to etching capacity, to reduce a contact resistance as much as possible. The following respective embodiments may be same as that.

Figure 3A:
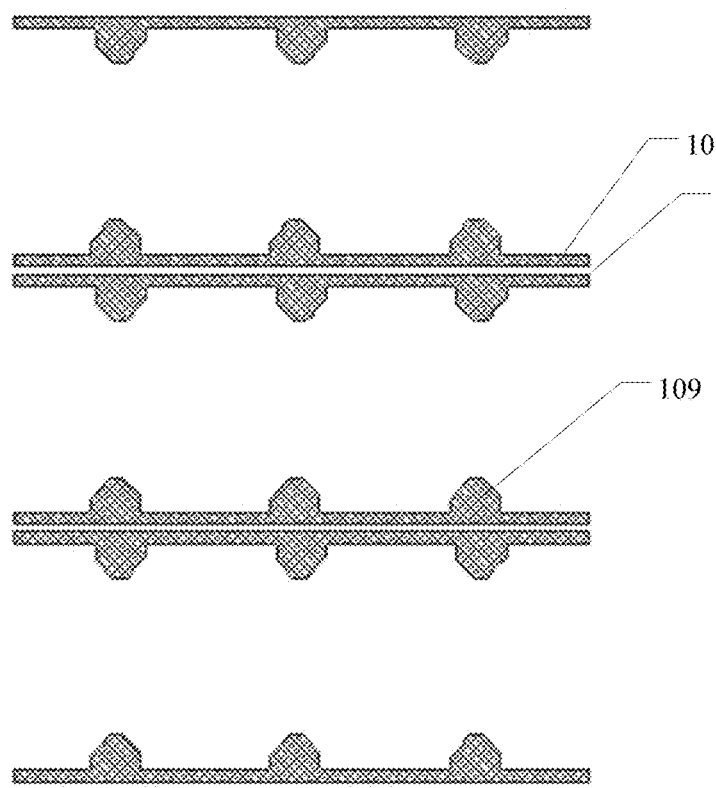
FIG. 3a is a schematic diagram of forming patterns of a gate electrode and scanning signal lines on a base substrate in a method of manufacturing an array substrate provided by an embodiment of the present disclosure.

For example, as illustrated in FIGS. 3a to 3e, a manufacturing method of the array substrate described above may comprise steps of:

(1) Forming a pattern of a gate electrode 109 and patterns of scanning signal lines 103 on a base substrate 100, as illustrated in FIG. 3a. Pixel units 101 in a (2N+1)-th column and a (2N+2)-th column are taken as one pixel unit group 104, wherein, N is selected from integers greater than or equal to zero. There are two scanning signal lines 103 between two adjacent rows of pixel units 101.

(2) Forming a gate insulating layer 110 on the pattern of the gate electrode 109 and the patterns of the scanning signal lines 103.

Figure 3B:
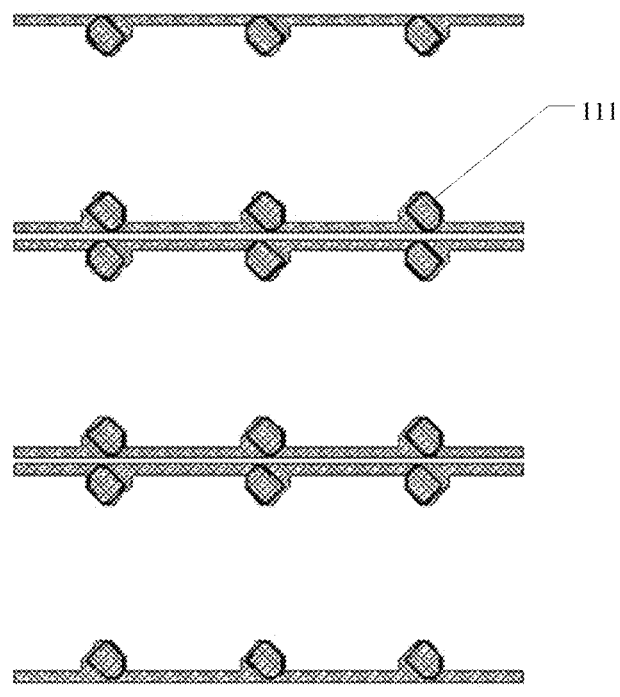
FIG. 3b is a schematic diagram of forming a pattern of an active layer on a gate electrode insulating layer in the method of manufacturing the array substrate provided by the embodiment of the present disclosure.

(3) Forming a pattern of an active layer 111 on the gate insulating layer 110, as illustrated in FIG. 3b.

Figure 3C:
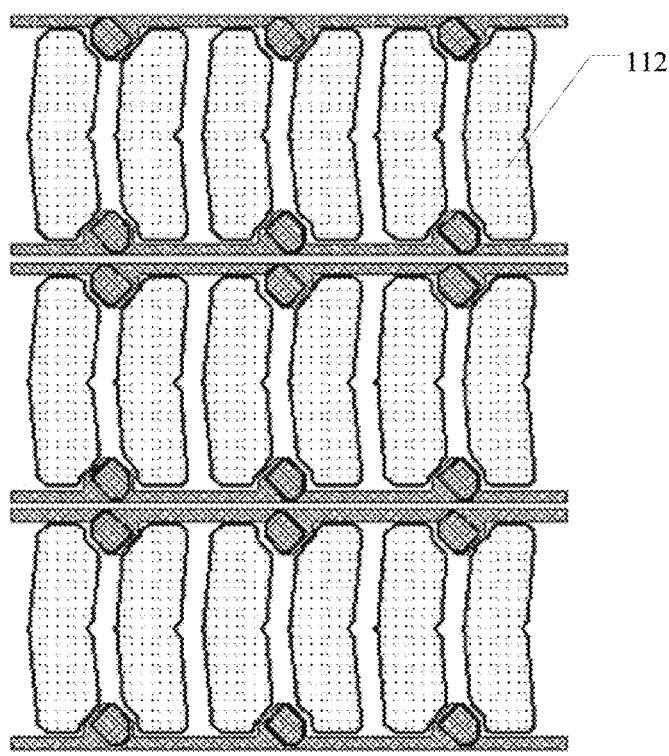
FIG. 3c is a schematic diagram of forming a pattern of an active layer on the gate electrode insulating layer in the method of manufacturing the array substrate provided by the embodiment of the present disclosure.

(4) Forming pattern of pixel electrodes 112 on the gate insulating layer 110, as illustrated in FIG. 3c.

(5) Forming a pattern of a data signal line 105 and patterns of common electrode lines 102 extending along a direction of the data line (extending along a column direction of a plurality of pixel units arranged in a matrix) in a gap of the patterns of the pixel electrodes 112. Please refer to FIG. 1a and FIG. 2a, there is a data signal line 105 between two columns of pixel units 101 in each pixel unit group 104, and each pixel unit group 104 shares the data signal line 105 between the two columns of pixel units 101, and the data signal line extends along the column direction. The respective common electrode lines 102 are located between two adjacent pixel unit groups 104. For example, the common electrode lines and the scanning signal lines are arranged in different layers, and may be directly overlapped with each other.

Figure 3D:
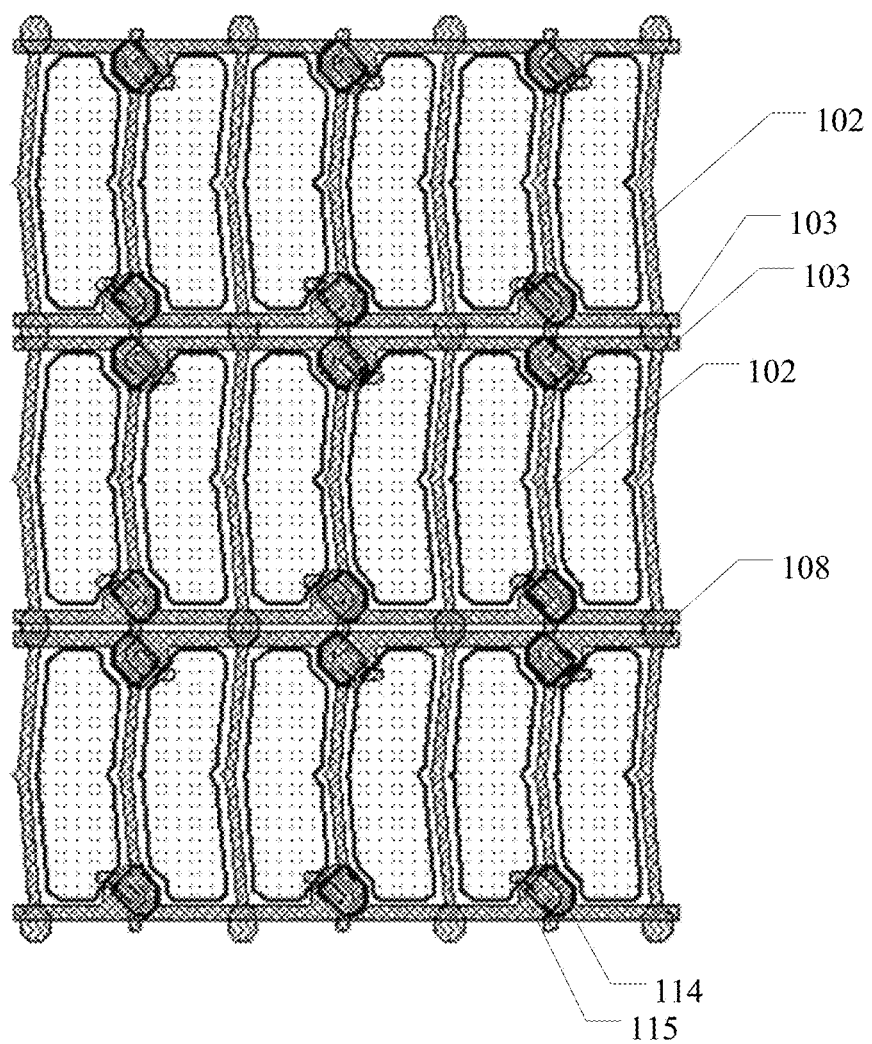
FIG. 3d is a schematic diagram of forming patterns of pixel electrodes, a source electrode and a drain electrode on the gate electrode insulating layer in the method of manufacturing the array substrate provided by the embodiment of the present disclosure.

(6) Forming a pattern of the source electrode 114, a pattern of the drain electrode 115, the respective pixel electrodes 112 being electrically connected with the drain electrode 115 of the corresponding thin film transistor, as illustrated in FIG. 3d, or referring to FIG. 2c. The related information about the thin film transistor, the active layer 111, the source electrode 114 and the drain electrode 115 therein may be also referred to FIG. 2a.

(7) Forming a first insulating layer 107 on patterns of the common electrode line 102, the data signal line 105, the source electrode 114 and the drain electrode 115, and forming patterns of via holes 108 of insulating layer in the first insulating layer 107, as illustrated in FIG. 3d.

Figure 3E:
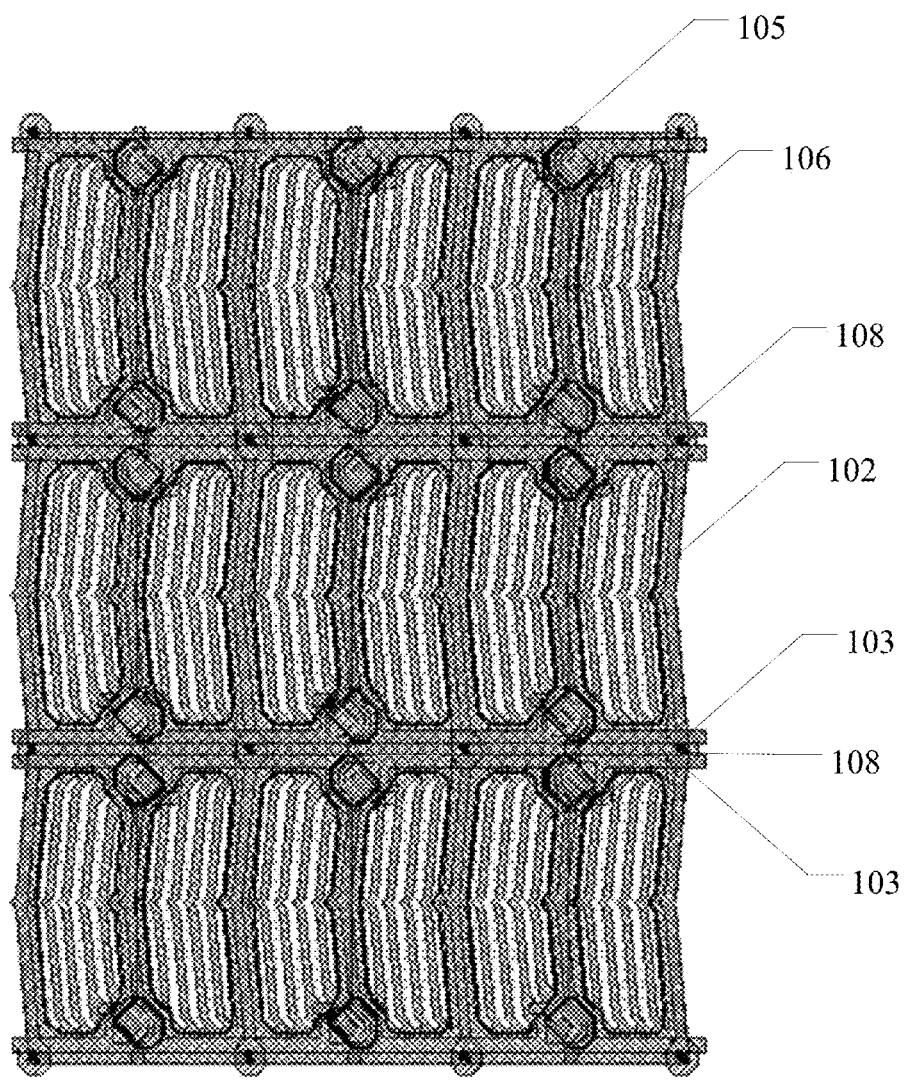
FIG. 3e is a schematic diagram of forming a pattern of a common electrode on an insulating layer in the method of manufacturing the array substrate provided by the embodiment of the present disclosure.

(8) Forming patterns of common electrodes 106 on the first insulating layer 107, the common electrodes 106 being electrically connected with the common electrode lines 102 through the via holes 108 located in the first insulating layer 107, as illustrated in FIG. 3e, or referring to FIG. 2a and FIG. 2c.

Therefore, an array substrate having a cross-sectional view in position A-A' of FIG. 2a as illustrated in FIG. 2b, and a cross-sectional view in position B-B' of FIG. 2a as illustrated in FIG. 2c, may be formed.

For example, in one example of the embodiment, a process flow of the array substrate may be briefly described as follows: a gate electrode layer→a gate insulating layer→an active layer→a pixel electrode layer→a source-drain electrode layer→an insulating layer→a common electrode layer.

For example, a sequence of forming a pixel electrode layer and a source-drain electrode layer may be adjusted. For example, in another example of the embodiment, a process flow of the array substrate may be briefly described as follows: a gate electrode layer→a gate insulating layer→an active layer→a source-drain electrode layer→a pixel electrode layer→an insulating layer→a common electrode layer.

It should be noted that, a structure of the array substrate is not limited to situations illustrated in FIG. 2b and FIG. 2c. An array substrate having any other structure may be also used, as long as the respective common electrode lines 102 are located between two adjacent pixel unit groups 104, and the respective common electrode lines 102 and the data signal line 105 are arranged in a same layer.

Figure 4A:
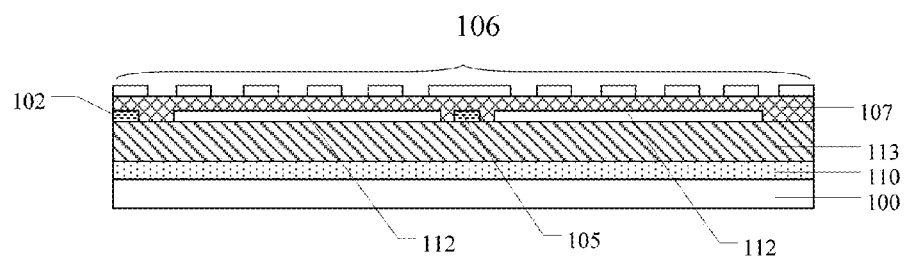
FIG. 4a is a cross-sectional view along an A-A' direction of another array substrate illustrated in FIG. 1a provided by an embodiment of the present disclosure.
Figure 4B:
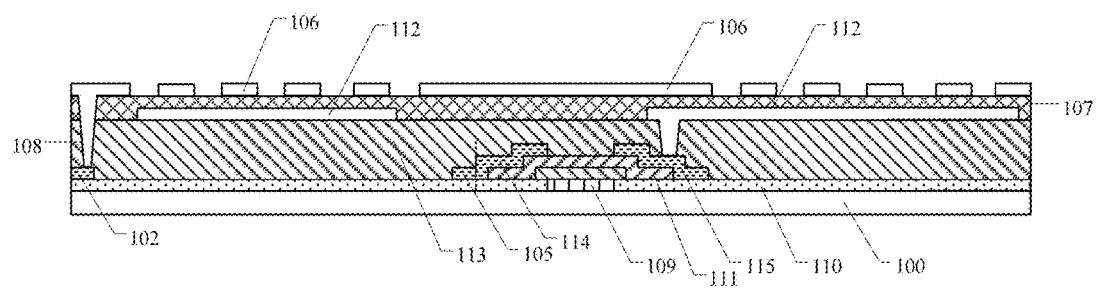
FIG. 4b is a cross-sectional view along a B-B' direction of another array substrate illustrated in FIG. 1a provided by the embodiment of the present disclosure.

For example, schematic diagrams of the array substrate are illustrated in FIG. 1a and FIG. 2a, and descriptions related to FIG. 1a and FIG. 2a may refer to the above descriptions. And a cross-sectional view in position A-A' is illustrated in FIG. 4a, and a cross-sectional view in position B-B' is illustrated in FIG. 4b. FIG. 4a and FIG. 4b are an array substrate of HADS mode, and a gate electrode 109 is arranged on the base substrate 100. A gate insulating layer 110 is arranged on a layer where the gate electrode 109 is located. An active layer 111 is arranged on the gate insulating layer 110. A common electrode line 102, a source electrode 114 and a drain electrode 115 are arranged on the active layer 111. The common electrode line 102 is located between two adjacent pixel unit groups 104, and the common electrode line 102 and the data signal line 105 are arranged in a same layer. The source electrode 114 and the drain electrode 115 are arranged on the active layer 111 apart from each other, and are both connected with the active layer 111, and a channel region is defined by a gap between the source electrode 114 and the drain electrode 115. A second insulating layer 113 is arranged above the common electrode line 102, the source electrode 114 and the drain electrode 115. Pixel electrodes 112 are arranged on the second insulating layer 113, and the pixel electrodes 112 are electrically connected with the drain electrode 115. A first insulating layer 107 is arranged on a layer where the pixel electrodes 112 are located. Common electrodes 106 are arranged on the first insulating layer 107, and the common electrodes 106 are electrically connected with the common electrode lines 102 through the via holes 108 of insulating layer. A via hole 108 of insulating layer is arranged in the first insulating layer 107 and the second insulating layer 113.

For example, the second insulating layer 113 may be an organic insulating layer. The organic insulating layer, for example, may be made of resin. For example, the organic insulating layer is made of acrylic resin or polyimide resin. For example, the first insulating layer is made of one or more of silicon nitride (SiNx), silicon oxide (SiOx) and silicon oxynitride (SiNxOy). The following respective embodiments may be same as that.

For example, in another example of the embodiment, a process flow of the array substrate may be briefly described as follows: a gate electrode layer→a gate insulating layer→an active layer→a source-drain electrode layer→an organic film insulating layer→a pixel electrode layer→an insulating layer→a common electrode layer.

For example, as illustrated in FIG. 2a, a plurality of thin film transistors may be arranged obliquely. As illustrated in FIG. 2a and FIG. 2c, the array substrate comprises a plurality of thin film transistors 150, and each of the thin film transistors 150 includes a gate electrode 109, an active layer 111, a source electrode 114 and a drain electrode 115. The source electrode 114 and the drain electrode 115 are arranged on the active layer 111 apart from each other, and are both connected with the active layer 111. A channel region is defined by a gap between the source electrode 114 and the drain electrode 115. An extending direction of the channel region may be not parallel to the scanning signal line or the data signal line. That is, an angle between the channel region and the scanning signal line and an angle between the channel region and the data signal line are not right angles. It should be noted that, the embodiment herein is only described by taking a thin film transistor having a U-shaped channel for example, but the embodiment of the present disclosure is not limited thereto. For example, the thin film transistor herein may also be a thin film transistor having a rectangular channel.

For example, in pixels of a same row, two pixel units on both sides of the data line are connected with different scanning signal lines, for example, connected with the scanning signal lines of different rows, and driven by the scanning signal lines of different rows. The thin film transistor may be placed vertically, or placed horizontally, or placed obliquely, which is not limited. The scanning signal line is used for providing a turning-on or turning-off signal to the thin film transistor, and the data signal line is used for providing a data signal to the pixel electrode, to realize gray display by controlling deflection of liquid crystal.

In the embodiment, a common electrode line extending along a row direction of a plurality of pixel units (parallel to a scanning signal line) is removed, and only a plurality of common electrode lines extending along a column direction of the plurality of pixel units (parallel to a data signal line) are reserved. Since the common electrode line extending along the row direction of the plurality of pixel units (parallel to the scanning signal line) is removed, an aperture ratio is greatly improved. Moreover, the common electrode lines 102 and the data signal line 105 are arranged in a same layer. The common electrode lines 102 and the data signal line 105 may be formed by using a same patterning process, to save process steps.

Embodiment 2

Figure 5A:
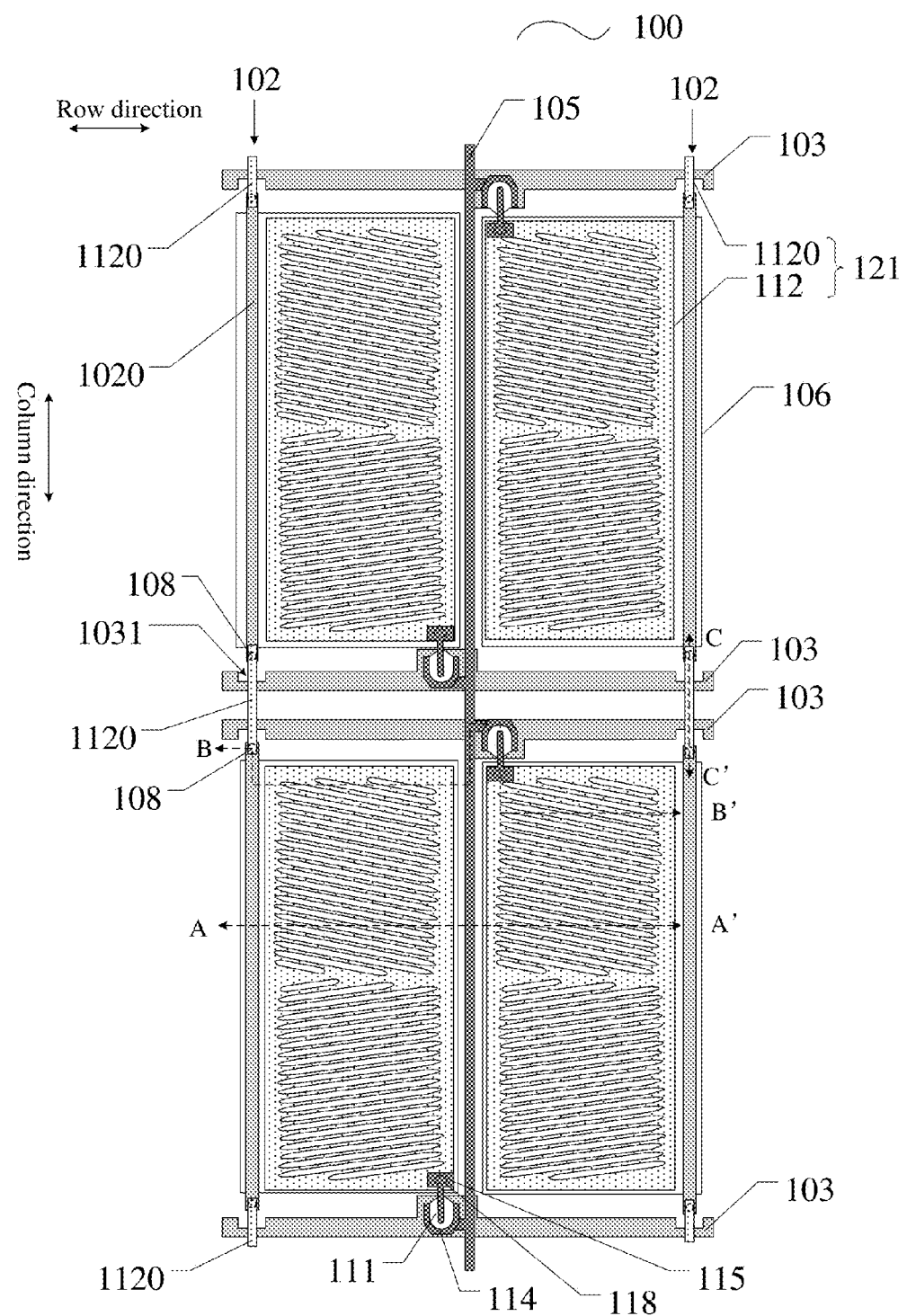
FIG. 5a is a schematic diagram of a dotted part illustrated in FIG. 1a provided by another embodiment of the present disclosure.

The embodiment provides an array substrate, as illustrated in FIG. 1a and FIG. 5a, comprising a base substrate 100, a plurality of pixel units 101 arranged in a matrix along a row direction and a column direction and a plurality of common electrode lines 102 extending along the column direction on the base substrate 100. There are two scanning signal lines 103 between two adjacent rows of pixel units 101, and pixel units 101 in a (2N+1)-th column and a (2N+2)-th column are taken as one pixel unit group 104, wherein, N is selected from integers greater than or equal to zero.

Two pixel units 101 of a same row in a same pixel unit group (belonging to a same row) are connected with different scanning signal lines 103, for example, connected with scanning signal lines 103 of different rows, and the scanning signal lines 103 extend along the row direction.

There is a data signal line 105 between two columns of pixel units 101 in each pixel unit group 104, and each pixel unit group 104 shares the data signal line 105 between the two columns of pixel units 101, and the data signal line 105 extends along the column direction.

Figure 5B:
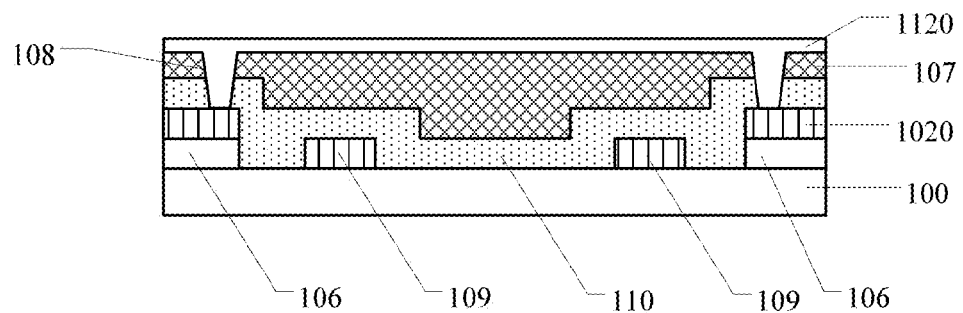
FIG. 5b is a cross-sectional view along a C-C' direction of the array substrate illustrated in FIG. 1a provided by another embodiment of the present disclosure.

As illustrated in FIG. 5a, the respective common electrode lines 102 are located between two adjacent pixel unit groups 104. The common electrode lines 102 include a plurality of main body portions 1020 of common electrode lines and a plurality of connecting lines 1120. As illustrated in FIG. 5a and FIG. 5b, the plurality of main body portions 1020 of common electrode lines and the scanning signal lines 109 are arranged in a same layer, and disconnected in positions of two scanning signal lines between two adjacent rows of pixel units. The array substrate further comprises a pixel electrode layer 121, and the pixel electrode layer 121 includes a pixel electrode 112 and a plurality of connecting lines 1120 in each pixel unit, and the respective connecting lines 1120 are connected with the respective common electrode lines 102 which are disconnected in positions of the scanning signal lines 103 through via holes 108. Therefore, in a column direction, two adjacent main body portions 1020 of common electrode lines are connected by a connecting line 1120, to form a common electrode line 102 extending along the column direction. A cross-sectional view along a C-C' direction of FIG. 5a is illustrated in FIG. 5b.

Figure 5C:
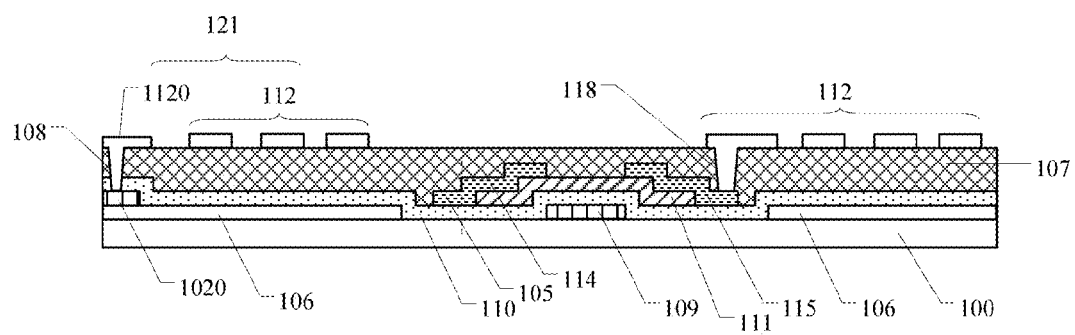
FIG. 5c is a cross-sectional view along a B-B' direction of the array substrate illustrated in FIG. 1a provided by another embodiment of the present disclosure.

For example, a cross-sectional view along a B-B' direction of the array substrate may be as illustrated in FIG. 5c, and FIG. 5c is an array substrate of an Advanced-Super Dimensional Switching (ADS) mode; common electrodes 106 are arranged on the base substrate 100, a plurality of main body portions 1020 of common electrode lines extending along a column direction are arranged on the common electrodes 106, and a gate electrode 109 and scanning signal lines 103 (not illustrated, and FIG. 5a and FIG. 6d may be referred to) are arranged in a gap between two adjacent common electrodes in a row direction. The main body portions 1020 of common electrode lines, the gate electrode 109 and the scanning signal lines 103 are arranged in a same layer. A gate insulating layer 110 is arranged above the gate electrode 109, the scanning signal lines 103, the main body portions 1020 of common electrode lines and the common electrodes 106. An active layer 111 is arranged above the gate insulating layer 110. A source electrode 114, a drain electrode 115 and a data signal line 105 are arranged above the active layer 111 (FIG. 5a may also be referred to). The source electrode 114 and the drain electrode 115 are arranged on the active layer 111 apart from each other, and are both connected with the active layer 111, and a channel region is defined by a gap between the source electrode 114 and the drain electrode 115. A first insulating layer 107 is arranged above the source electrode 114, the drain electrode 115 and the data signal line 105. Via holes 118 of insulating layer are arranged in the first insulating layer 107, a pixel electrode layer 121 is arranged on the first insulating layer 107, and the pixel electrode layer 121 includes a plurality of pixel electrodes 112 and a plurality of connecting lines 1120. The pixel electrodes 112 are connected with the drain electrode 115 through the via holes of insulating layer. In a column direction, two adjacent main body portions 1020 of common electrode lines are connected by a connecting line 1120, to form a common electrode line 102 extending along the column direction.

Figure 5D:
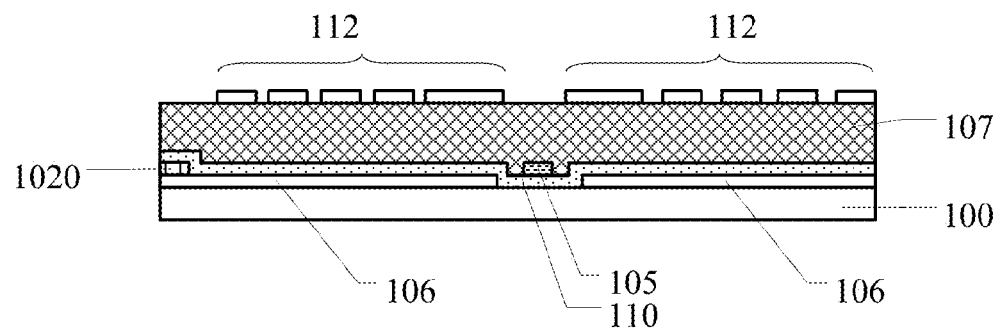
FIG. 5d is a cross-sectional view along an A-A' direction of the array substrate illustrated in FIG. 1a provided by another embodiment of the present disclosure.

For example, a cross-sectional view along an A-A' direction of the array substrate may be as illustrated in FIG. 5d, and common electrodes 106 are arranged on the base substrate 100, main body portions 1020 of common electrode lines are arranged on the common electrodes, and the main body portions 1020 of common electrode lines are electrically connected with common electrodes 106 in two columns of pixel units adjacent thereto. For example, the main body portion 1020 of each common electrode line is electrically connected with common electrodes 106 in two columns of pixel units adjacent thereto, or part of the main body portion 1020 of each common electrode line is electrically connected with common electrodes 106 in two columns of pixel units adjacent thereto. FIG. 5a may be also referred to.

For example, the embodiment further provides a manufacturing method of the array substrate described above, and the method may comprise steps as follows.

Figure 6A:
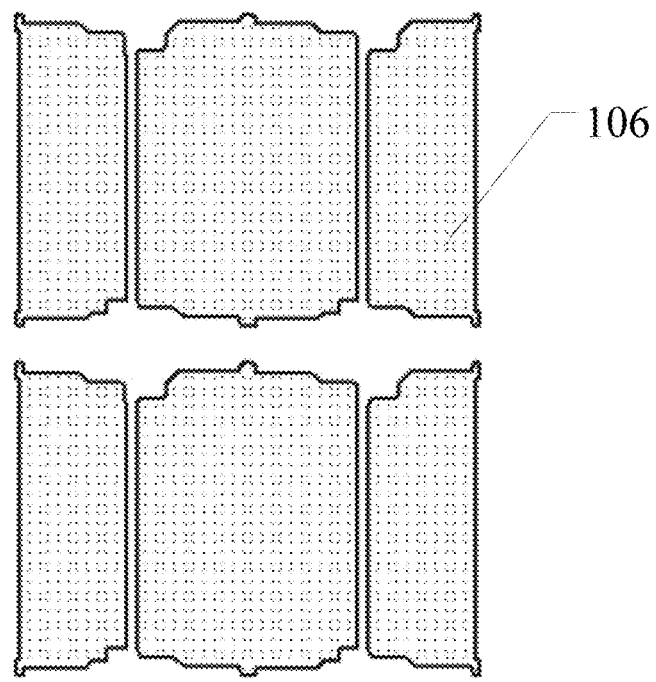
FIG. 6a is a schematic diagram of forming a pattern of a common electrode on a base substrate in a method of manufacturing an array substrate provided by another embodiment of the present disclosure.
Figure 6B:
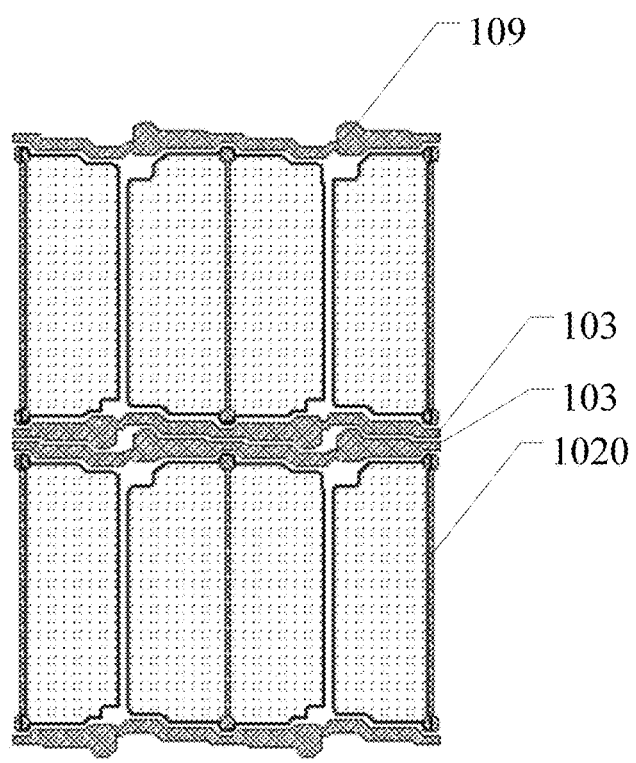
FIG. 6b is a schematic diagram of forming patterns of forming a gate electrode, scanning signal lines and a main body portion of common electrode line in the method of manufacturing the array substrate provided by another embodiment of the present disclosure.

(1) Forming a pattern of a common electrode 106 on a base substrate 100, as illustrated in FIG. 6a;

(2) Forming a gate electrode 109 and scanning signal lines 103 in a gap between two adjacent common electrodes in a row direction, the scanning signal lines 103 extending along the row direction, and forming a main body portion 1020 of common electrode line on the pattern of the common electrode 106, the main body portion 1020 of common electrode line being located on the common electrode 106 and between the two scanning signal lines 103, as illustrated in FIG. 6*b*. The main body portion 1020 of common electrode line is disconnected in positions of the two scanning signal lines between two adjacent rows of pixel units.

(3) Forming a gate insulating layer 110 above a layer where the gate electrode 109, the scanning signal lines 103, the main body portions 1020 of common electrode lines and the common electrodes 106 are located.

Figure 6C:
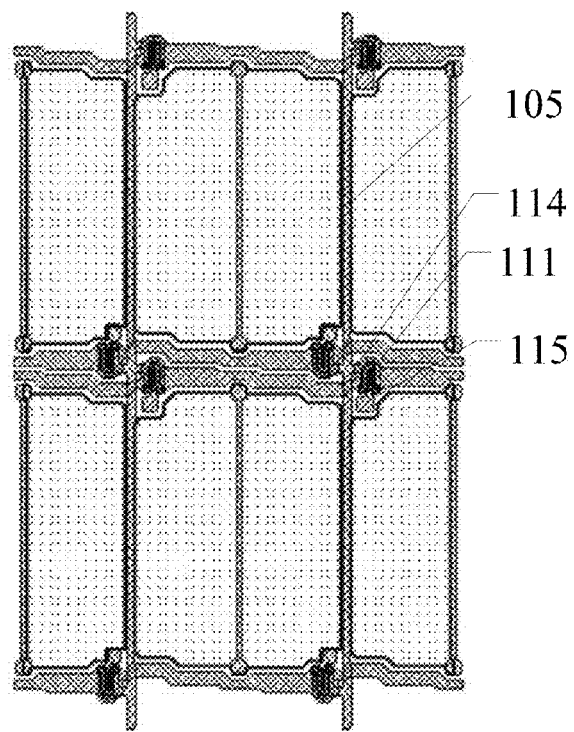
FIG. 6c is a schematic diagram of forming patterns of an active layer, a source electrode and a drain electrode in the method of manufacturing the array substrate provided by another embodiment of the present disclosure.

(4) Forming a pattern of an active layer 111 above the gate insulating layer 110. Forming patterns of the source electrode 114, the drain electrode 115 and the data signal line 105 above the active layer 111, as illustrated in FIG. 6*c*. A related thin film transistor and the active layer 111, the source electrode 114, the drain electrode 115 included therein may be also seen referring to FIG. 5*a*. The source electrode 114 and the drain electrode 115 are arranged on the active layer 111 apart from each other, and are both connected with the active layer 111, and a channel region is defined by a gap between the source electrode 114 and the drain electrode 115.

Figure 6D:
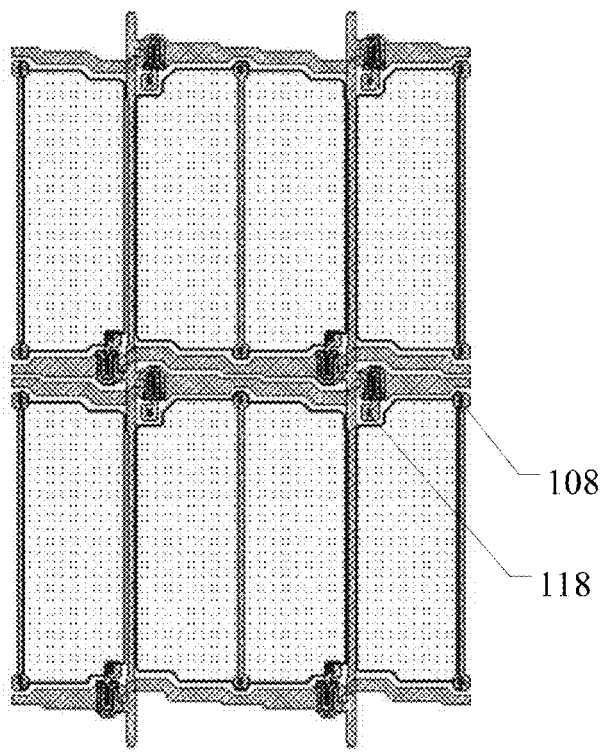
FIG. 6d is a schematic diagram of forming patterns of a via hole in a first insulating layer in the method of manufacturing the array substrate provided by another embodiment of the present disclosure.
Figure 6E:
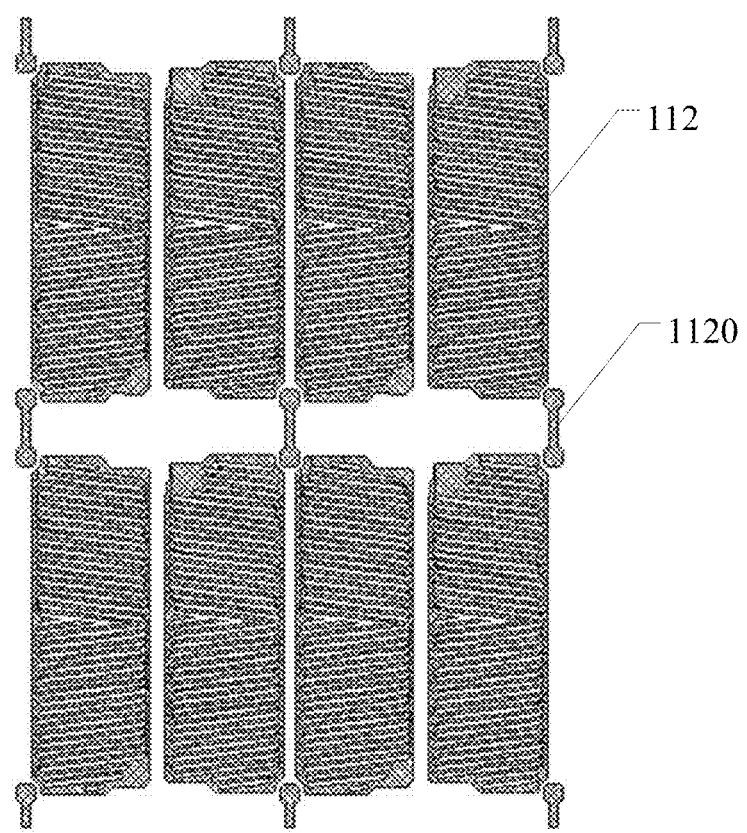
FIG. 6e is a schematic diagram of forming a pattern of a pixel electrode on a first insulating layer in the method of manufacturing the array substrate provided by another embodiment of the present disclosure.

(5) Forming a first insulating layer 107 above a layer where the source electrode 114, the drain electrode 115 and the data signal line 105 are located. Forming via holes 118 of insulating layer in the first insulating layer 107, and forming via holes 118 of insulating layer in the gate insulating layer and the first insulating layer 107, as illustrated in FIG. 6*d*, or referring to FIG. 5*c*.

Figure 6F:
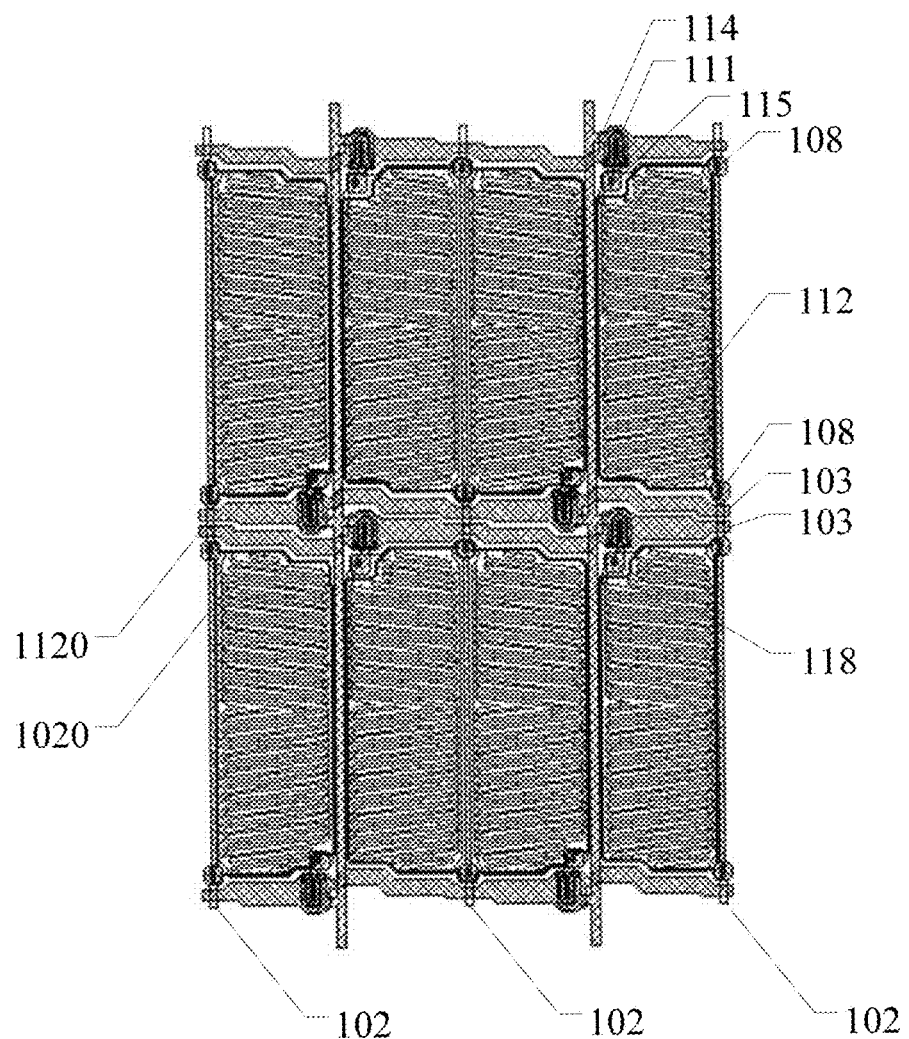
FIG. 6f is a schematic diagram after forming the pixel electrode in the method of manufacturing the array substrate provided by another embodiment of the present disclosure.

(6) Forming a pixel electrode layer 121 on the first insulating layer 107, and the pixel electrode layer 121 including pixel electrodes 112 and connecting lines 1120. The pixel electrodes 112 are connected with the drain electrode 115 through the via holes 118 of insulating layer. The connecting lines 1120 are electrically connected with the main body portions 1020 of common electrode lines through the via holes 108 of insulating layer. In a column direction, two adjacent main body portions 1020 of common electrode lines are connected by a connecting line 1120, to form a common electrode line 102 extending along the column direction. The formed array substrate may be as illustrated in FIG. 6*f*, or may be as illustrated in FIG. 5*a*.

For example, in one example of the embodiment, a process flow of the array substrate may be briefly described as follows: a common electrode layer→a gate electrode layer→a gate insulating layer→an active layer→a source-drain electrode layer→an insulating layer→a pixel electrode layer.

It should be noted that, a structure of the array substrate is not limited to situations illustrated in FIG. 5*a* to FIG. 5*d* and FIG. 6*f*. An array substrate having any other structure may be also used, as long as the respective main body portions of common electrode lines are arranged in a same layer with the scanning signal lines, and disconnected in positions of the two scanning signal lines between two adjacent rows of pixel units. The pixel electrode layer includes a pixel electrode and a plurality of connecting lines located in each pixel unit, and the respective connecting lines are connected with the respective main body portions of common electrode lines disconnected in the positions of the scanning signal lines through via holes.

For example, as illustrated in FIG. 5*a*, the scanning signal lines 103 is located in a layer different from that of the connecting lines 1120, and narrowed in a position 1031 overlapping with the connecting line. The scanning signal lines are narrowed in the positions where the scanning signal lines 103 and the connecting lines 1120 are overlapped with each other, so as to reduce a distance from an upper via hole to a lower via hole, a distance of bridging the connecting lines, and a resistance of the connecting line, and further a resistance of the common electrode extending along a direction of the data signal line (a vertical direction, a column direction). And meanwhile, an aperture ratio of pixel may be improved to a certain degree.

In the embodiment, a common electrode line extending along a row direction of a plurality of pixel units (parallel to a scanning signal line) is removed, and only a plurality of common electrode lines extending along a column direction of the plurality of pixel units (parallel to a data signal line) are reserved. Since the common electrode line extending along the row direction of the plurality of pixel units (parallel to the scanning signal line) is removed, an aperture ratio is greatly improved. Moreover, the main body portions of common electrode lines are arranged in a same layer with the scanning signal lines. The main body portions of common electrode lines and the scanning signal lines may be formed by using a same patterning process, the connecting line for connecting two adjacent main body portions of common electrode lines in a direction of the data line may be arranged in a same layer with the pixel electrodes, and formed by using a same patterning process as the pixel electrodes, so that process step may be saved.

Embodiment 3

The embodiment provides a display panel, which may comprise the array substrate according to any embodiment described above.

Since the display panel comprises the array substrate of any embodiment of the present disclosure, the display panel may have same technical effects as the respective array substrates. For example, the display panel has a high aperture ratio.

Embodiment 4

The embodiment provides a display device, which comprises the display panel described above.

Since the display device comprises the display panel of any embodiment of the present disclosure, and the display panel comprises the array substrate of any embodiment of the present disclosure, the display device may have same technical effects as the respective array substrates. For example, the display panel has a high aperture ratio.

It should be noted that, the respective embodiments of the present disclosure are described by taking the ADS and HADS modes for example, but are not limited thereto. For example, other modes such as an In-Plane Switching (IPS) mode may be also applicable.

In addition, the respective embodiments of the present disclosure are described by taking an example that the common electrode line is a straight line type and extends along a column direction, but is not limited thereto. For example, the common electrode line may be not the straight line type.

At least one embodiment of the present disclosure provides an array substrate and a manufacturing method thereof, a display panel and a display device; the array substrate comprises a base substrate, a plurality of pixel units arranged in a matrix along a row direction and a column direction and a plurality of common electrode lines extending along the column direction on the base substrate.

There are two scanning signal lines between two adjacent rows of pixel units, and pixel units in a (2N+1)-th column and a (2N+2)-th column are taken as one pixel unit group, N being selected from integers greater than or equal to zero.

Two pixel units of a same row in a same pixel unit group are connected with different scanning signal lines, the scanning signal lines extending along the row direction; there is a data signal line between two columns of pixel units in each pixel unit group, and each pixel unit group shares the data signal line between the two columns of pixel units, the data signal line extending along the column direction; the respective common electrode lines are located between two adjacent pixel unit groups.

At least one embodiment of the present disclosure provides an array substrate, a display panel and a display device, which may have at least one of the following advantages:

(1) A common electrode line extending along a row direction of a plurality of pixel units (parallel to a scanning signal line) is removed, and only a plurality of common electrode lines extending along a column direction of the plurality of pixel units (parallel to a data signal line) are reserved. Since the common electrode line extending along the row direction of the plurality of pixel units (parallel to the scanning signal line) is removed, an aperture ratio is greatly improved.

(2) The common electrode lines and the data signal line may be arranged in a same layer. The common electrode lines and the data signal line may be formed by using a same patterning process, to save process steps.

(3) The main body portions of common electrode lines and the scanning signal lines may be arranged in a same layer. The main body portions of common electrode lines and the scanning signal lines may be formed by using a same patterning process, the connecting line for connecting two adjacent main body portions of common electrode lines in a direction of the data line (a column direction) may be arranged in a same layer with the pixel electrodes, and formed by using a same patterning process as the pixel electrodes, so that process step may be saved.

(4) The via holes of insulating layer may be arranged in a period of 1/X. The periodic arrangement of the via holes of insulating layer may balance a common voltage of the display screen. The plurality of common electrode lines extending along the column direction may improve a greenish phenomenon of the display screen.

(5) The respective scanning signal lines are narrowed in positions overlapping with the connecting lines, so as to reduce a distance of bridging the connecting lines, further reduce a resistance of the connecting line.

There are some points to be illustrated:

(1) Drawings of the embodiments of the present disclosure only refer to structures related with the embodiments of the present disclosure, and general designs may be referred to for other structures.

(2) In order to make it clear, in the drawings for illustrating the embodiments of the present disclosure, a thickness of a layer or a region is magnified or reduced, that is, those drawings are not drawn according to actual proportion. It should be understood that, when elements such as a layer, a film, a region or a substrate and the like are called to be "above" or "below" another element, the element may be directly located "on" or "beneath" the other element, or there may be an intermediate element.

(3) In a case of no conflict, the embodiments of the present disclosure and the features of the embodiments may be combined with each other to form new embodiments.

The foregoing embodiments merely are specific implementation modes of the present disclosure, but a protection scope of the present disclosure is not limited thereto, changes or replacements easily conceived by any skilled in art within the technical scope disclosed by the present disclosure should be covered by the protection scope of the present disclosure. Therefore, the protection scope of the present disclosure is determined by a protection scope of claims.

The application claims priority to the Chinese patent application No. 201510685426.X, filed Oct. 20, 2015, the disclosure of which is incorporated herein by reference as part of the application.

The invention claimed is:

1. An array substrate, comprising a base substrate, a plurality of pixel units arranged in a matrix along a row direction and a column direction and a plurality of common electrode lines extending along the column direction on the base substrate; wherein, there are two scanning signal lines between two adjacent rows of pixel units, and pixel units in a (2N+1)-th column and a (2N+2)-th column are taken as one pixel unit group, N being selected from integers greater than or equal to zero;
   two pixel units of a same row in a same pixel unit group are connected with different scanning signal lines, the scanning signal lines extending along the row direction;
   there is one data signal line between two columns of pixel units in each pixel unit group, and each pixel unit group shares the data signal line between the two columns of pixel units, the data signal line extending along the column direction;
   the respective common electrode lines are located between two adjacent pixel unit groups,
   wherein, the respective common electrode lines include two parts, one part including a plurality of main body portions of common electrode lines, the plurality of main body portions of common electrode lines being arranged in a layer the same as that of the scanning signal lines, and disconnected in positions of the two scanning signal lines between two adjacent rows of pixel units, and another part including a plurality of connecting lines, the plurality of connecting lines and pixel electrodes being arranged in a same layer, the respective connecting lines being connected with two of the main body portions of common electrode lines disconnected in the positions of the scanning signal lines through via holes.

2. The array substrate according to claim 1, further comprising common electrodes, wherein, the plurality of main body portions of common electrode lines in the respective common electrode lines are electrically connected with the common electrodes in two columns of pixel units adjacent thereto.

3. The array substrate according to claim 1, wherein, the respective scanning signal lines are narrowed in positions overlapping with the connection lines.

4. The array substrate according to claim 1, wherein, in pixel units of a same row, two adjacent pixel units in adjacent pixel unit groups are connected with different scanning signal lines or connected with a same scanning signal line.

5. The array substrate according to claim 1, wherein, there is one of the common electrode lines between every two adjacent pixel unit groups.

6. A display panel, comprising the array substrate according to claim 1.

7. A display device, comprising the display panel according to claim 6.

8. A manufacturing method of an array substrate, comprising forming a plurality of pixel units arranged in a matrix along a row direction and a column direction and a plurality of common electrode lines extending along the column direction on a base substrate; wherein, there are two scanning signal lines between two adjacent rows of pixel units, and pixel units in a (2N+1)-th column and a (2N+2)-th column are taken as one pixel unit group, N being selected from integers greater than or equal to zero;

connecting two pixel units of a same row in a same pixel unit group with different scanning signal lines, the scanning signal lines extending along the row direction;

forming one data signal line between two columns of pixel units in each pixel unit group, and each pixel unit group sharing the data signal line between the two columns of pixel units, the data signal line extending along the column direction; and forming the respective common electrode lines between two adjacent pixel unit groups, wherein, the respective common electrode lines include two parts, one part including a plurality of main body portions of common electrode lines, the plurality of main body portions of common electrode lines being formed in a layer the same as that of the scanning signal lines, and disconnected in positions of the two scanning signal lines between two adjacent rows of pixel units, and the other part including a plurality of connecting lines, the plurality of connecting lines and pixel electrodes being formed in a same layer, the respective connecting lines being connected with two of the main body portions of common electrode lines disconnected in the positions of the scanning signal lines through via holes.

9. The manufacturing method of the array substrate according to claim 8, further comprising forming common electrodes, wherein, the plurality of main body portions of common electrode lines in the respective common electrode lines are electrically connected with the common electrodes in two columns of pixel units adjacent thereto.

10. The manufacturing method of the array substrate according to claim 8, wherein, one of the common electrode lines is formed between every two adjacent pixel unit groups.

11. An array substrate, comprising a base substrate, a plurality of pixel units arranged in a matrix along a row direction and a column direction and a plurality of common electrode lines extending along the column direction on the base substrate; wherein, there are two scanning signal lines between two adjacent rows of pixel units, and pixel units in a (2N+1)-th column and a (2N+2)-th column are taken as one pixel unit group, N being selected from integers greater than or equal to zero;

two pixel units of a same row in a same pixel unit group are connected with different scanning signal lines, the scanning signal lines extending along the row direction;

there is one data signal line between two columns of pixel units in each pixel unit group, and each pixel unit group shares the data signal line between the two columns of pixel units, the data signal line extending along the column direction;

the respective common electrode lines are located between two adjacent pixel unit groups, wherein, the array substrate further comprises at least one insulating layer, wherein, the at least one insulating layer is located between a layer where the common electrode lines are located and a layer where the common electrodes are located, the common electrodes being electrically connected with the common electrode lines through via holes located in the insulating layer.

12. The array substrate according to claim 11, wherein, the respective common electrode lines and the data signal line are arranged in a same layer.

13. The array substrate according to claim 11, wherein, the via holes of insulating layer are arranged periodically.

14. The array substrate according to claim 13, wherein, the via holes of insulating layer are arranged periodically, and in the column direction, one of the via holes of insulating layer is arranged every X pixel units, X being an integer greater than zero.

* * * * *